United States Patent
Chwalek et al.

(10) Patent No.: US 12,296,361 B2
(45) Date of Patent: May 13, 2025

(54) HIGH FREQUENCY ULTRASONIC TRANSDUCER AND METHOD OF FABRICATION

(71) Applicant: Ascent Ventures, LLC, Pittsford, NY (US)

(72) Inventors: James M Chwalek, Pittsford, NY (US); Todd A Jackson, Walworth, NY (US)

(73) Assignee: BYK GARDNER GMBH, Wesel (DE)

( * ) Notice: Subject to any disclaimer, the term of this patent is extended or adjusted under 35 U.S.C. 154(b) by 1238 days.

(21) Appl. No.: 16/204,418

(22) Filed: Nov. 29, 2018

(65) Prior Publication Data

US 2020/0171544 A1    Jun. 4, 2020

(51) Int. Cl.
  *B06B 1/06*   (2006.01)
  *C03C 3/04*   (2006.01)
  *C03C 4/00*   (2006.01)
  *H10N 30/01*  (2023.01)
  *H10N 30/853* (2023.01)

(52) U.S. Cl.
  CPC ......... *B06B 1/0662* (2013.01); *B06B 1/0681* (2013.01); *C03C 3/04* (2013.01); *C03C 4/0057* (2013.01); *H10N 30/01* (2023.02); *H10N 30/853* (2023.02)

(58) Field of Classification Search
  CPC .................................................. B06B 1/0662
  See application file for complete search history.

(56) References Cited

U.S. PATENT DOCUMENTS

| | | | |
|---|---|---|---|
| 2,754,238 A | | 7/1956 | Arenberg |
| 3,131,460 A | | 5/1964 | Allen |
| 3,590,467 A | * | 7/1971 | Chase ............... H03H 3/007 29/25.35 |
| 3,599,123 A | * | 8/1971 | Krause ............... H03H 9/125 333/147 |
| 3,921,885 A | * | 11/1975 | Knox ............... B23K 35/001 228/208 |
| 4,123,731 A | | 10/1978 | Kanbara et al. |
| 4,544,859 A | | 10/1985 | Eoff |
| 4,779,452 A | * | 10/1988 | Cohen-Tenoudji ........... G01N 29/222 73/54.41 |
| 5,777,230 A | | 7/1998 | Vandervalk |

(Continued)

FOREIGN PATENT DOCUMENTS

DE    1957429 A1    6/1970

OTHER PUBLICATIONS

Y. Murozaki, S. Sakuma and F. Arai, "Detection of multi-biosignal using a quartz crystal resonator based wide range load sensor with compact frequency counter," 2016 IEEE/RSJ International Conference on Intelligent Robots and Systems (IROS), 2016, pp. 5585-5590 (Year: 2016).*

(Continued)

*Primary Examiner* — John A Bodnar

(74) *Attorney, Agent, or Firm* — Brown & Michaels, PC

(57) ABSTRACT

An ultrasonic transducer that includes a delay line, a piezoelectric element, and a metal conductive layer between the delay line and the piezoelectric element. The delay line and the piezoelectric element are acoustically joined with an atomic diffusion bond to facilitate coupling ultrasonic waves from the piezoelectric element into the delay line or from the delay line into the piezoelectric element.

23 Claims, 3 Drawing Sheets

(56) References Cited

U.S. PATENT DOCUMENTS

| | | | | |
|---|---|---|---|---|
| 9,478,707 B2* | 10/2016 | Guenard | ............ | H01L 25/0753 |
| 10,234,632 B1* | 3/2019 | Keeler | ................ | G02B 6/3834 |
| 2018/0290176 A1* | 10/2018 | Fukase | ................... | B06B 1/067 |

OTHER PUBLICATIONS

T. Shimatsu, M. Uomoto; Atomic diffusion bonding of wafers with thin nanocrystalline metal films. Journal of Vacuum Science & Technology B Jul. 1, 2010; 28 (4): 706-714. https://doi.org/10.1116/1.3437515 (Year: 2010).*

Eiji Higurashi, Heterogeneous Integration Based On Low-Temperature Bonding For Advanced Optoelectronic Device, 2018 Jpn. J. Appl. Phys. 57 04FA02, Published Mar. 5, 2018, (Year: 2018).*

Cong Liu, Hideki Hirano, Joerg Froemel, Shuji Tanaka, Wafer-level vacuum sealing using AgAg thermocompression bonding after fly-cut planarization, Sensors and Actuators A: Physical, vol. 261, (Year: 2017).*

T. Shimatsu; M. Uomoto; K. Oba; Y. Furukata, 2012 3rd IEEE International Workshop on Low Temperature Bonding for 3D Integration, May 22-23, 2012, p. 103. DOI: 10.1109/LTB-3D20071.2012.*

* cited by examiner

HIGH FREQUENCY ULTRASONIC TRANSDUCER AND METHOD OF FABRICATION

BACKGROUND OF THE INVENTION

The invention pertains to the field of transducers for ultrasonic devices. More particularly, the invention pertains to a high frequency ultrasonic transducer and method of fabrication.

Ultrasonic testing of materials requires an ultrasonic transducer to introduce an ultrasonic stimulus wave into a test material, and for transmitted or reflected ultrasonic waves to be detected and analyzed. The ultrasonic stimulus waves can be either compressive or shear waves. In some applications, two ultrasonic transducers can be used where one transducer introduces the stimulus wave and a second transducer detects reflected or transmitted waves. Alternatively, a single transducer can be used to both introduce the stimulus wave and to detect reflected waves. It is also common for such transducers to employ an acoustic delay line in order to introduce a pre-determined time delay between the stimulus wave and the reflected wave or waves.

The stimulus wave can be a high energy wave whereas the reflected wave is attenuated in comparison to this stimulus wave due to a number of energy loss mechanisms such as partial reflections from multiple surfaces, scattering, and absorption. The need to accurately measure the reflected wave necessitates a sensitive receiver with a high signal-to-noise ratio. As such, the stimulus signal can easily saturate the sensitive receiver electronics and a time delay is needed between the stimulus and reflected waves to allow sufficient recovery of the receiver electronics.

FIG. 1 is a cross section of a representative delay line transducer. The delay line 10 is acoustically coupled to an ultrasonic stimulus wave generator such as a piezoelectric element 12. Conductive electrodes 16 and 18 provide a means to apply a stimulus voltage to excite the piezoelectric material. Electrical contact to these electrodes is made through an electrical conductor such as a wire 20 and a means to make an electrical contact from the conductive electrode 16 to an electrically conductive housing 24. Such means, for example, may be a ring of electrically conductive epoxy 22. External electrical connection is made through an appropriate connector 26 mounted on the housing 24 to an appropriate stimulus wave signal generator and reflected or transmitted ultrasonic wave detecting electronics. A backing layer 28 is employed to provide both dampening of the vibrating piezoelectric material as well as to scatter and absorb the backwards traveling wave. Such a dampening layer, properly chosen, can result in a transducer with a short temporal response and high bandwidth resulting in a high resolution device. Such transducers are particularly useful in non-destructive testing and layer thickness metrology. The delay line 10 is typically fabricated using a sufficient thickness of a solid material (based on a sound velocity of the solid material) such as various glasses or plastics.

An example of a prior art transducer can be found in U.S. Pat. No. 5,777,230, incorporated herein by reference, entitled "DELAY LINE FOR AN ULTRASONIC PROBE AND METHOD OF USING SAME" and issued Jul. 7, 1998 to Vandervalk, discloses an ultrasonic transducer with a delay line acoustically coupled to the transducer so that ultrasonic vibrations may be transmitted into the delay line from the transducer in a first direction. The delay line includes a first and second section which forms an interface which is substantially perpendicular to the first direction; and the second section including a surface for coupling with a material to be investigated. This basic design is known in the art, but fails to teach how to reliably make transducers with reliable consistency and in reasonable volumes.

U.S. Pat. No. 4,123,731, incorporated herein by reference, entitled "GLASS FOR USE IN ULTRASONIC DELAY LINES" and issued Oct. 31, 1978 to Kanbara, discloses a glass suitable for use in ultrasonic delay lines which comprises the components by weight, $SiO_2$ 42 to 27%, PbO 71 to 52% and preferably contains $K_2O$ and/or $Na_2O$. Coupling of acoustic energy from the piezoelectric element 12 to this delay line 10 is critical for maintaining the performance sensitivity of the transducer to detect low amplitude ultrasonic waves. For low frequency transducers, the coupling means can simply be through a pressing contact between the transducer and the delay line. To enhance this coupling, and mitigate any surface non-uniformity between the transducer and delay line, a fluid such as water or glycerin can be used as an intermediary.

U.S. Pat. No. 4,544,859, incorporated herein by reference, entitled "NON-BONDED PIEZOELECTRIC ULTRASONIC TRANSDUCER" and issued Oct. 1, 1985 to Eoff discloses a mechanically assembled non-bonded ultrasonic transducer which includes a substrate, a piezoelectric film, a wetting agent, a thin metal electrode, and a lens held in intimate contact by a mechanical clamp. No epoxy or adhesive is used in the assembly of the device. However, as the frequency increases, and the wavelengths decrease, such means are not sufficient to attain high-performance coupling. Often, in this case, a thin adhesive 14 is used to structurally bond the transducer to the delay line.

While this method is widely employed it suffers from a variety of issues. Firstly, the adhesive is typically a softer material (lower acoustic impedance) than either the transducer or delay line, which decreases both the sensitivity and bandwidth performance of the transducer. At high frequencies the need for a thin bond layer in order to mitigate this effect becomes apparent. It is difficult to control the thickness and uniformity of a thin adhesive layer which can suffer from a number of mechanical failure modes due to such issues as surface adhesion problems and stress due to thermal expansion mismatch between the delay line and piezoelectric transducer materials. This can result in separation of the delay line from the transducer which causes a severe degradation of the transducer performance often to the point where the transducer is no longer usable. Consequently, for high performance, high frequency, reliable transducers, a better means of bonding the delay line to the transducer is clearly needed.

In the current art, due to the nature of the processes and materials used, high-frequency transducers are typically fabricated in small lots, often as single devices. Such fabrication, while providing functional devices, is sub-optimal from the standpoint of consistency and cost. If such devices could be produced using wafer level processes, similar to the approaches employed in the semiconductor or MEMS industry, then it follows that similar consistency and cost reduction advantages would be obtained. Current wafer-level bonding processes, though quite successful in the semiconductor or MEMS industries, are not well suited to delay line piezoelectric transducers.

Adhesive or polymer bonding, at the wafer level, may be employed but this approach suffers from the same issues as discussed previously. Other wafer level bonding techniques such as anodic, metal diffusion, thermo-compression, or eutectic-alloy bonding require the application of high temperatures and high pressures. While this is acceptable for some applications, the use of glass delay lines with piezoelectric materials for ultrasonic transducers precludes the use of high temperature due to the high stress that would result from the disparate coefficients of thermal expansion or CTE in the materials.

SUMMARY OF THE INVENTION

The present disclosure provides for an improved bonding of a delay line to a piezoelectric transducer, and improved wafer level processes to fabricate ultrasonic transducers in larger lots. According to an embodiment of the invention, an ultrasonic transducer includes a delay line, a piezoelectric element, and an interposing metal conductive layer between the delay line and the piezoelectric element. The delay line and the piezoelectric element are joined by an atomic diffusion bond so that ultrasonic waves may be coupled from the piezoelectric element into the delay line or from the delay line into the piezoelectric element.

The ultrasonic transducer delay line can be made from glass containing the elements of silicon or fluorine. The delay line can be made from fused silica, fused quartz, or single crystal silicon. The piezoelectric element can be made from a piezoelectric crystalline or ceramic material. The piezoelectric element can be made of: $LiNbO_3$, $LiIO_3$, PZT, $BaTiO_3$, ZnO, AlN, or Quartz. The interposing metal conductive layers are made from a group consisting essentially of: Cu, Al, Ti, Ta, Au, Ag, Ni, Fe, and Pt.

In an embodiment, the invention includes a method of producing an ultrasonic transducer. A delay line substrate material and a piezoelectric substrate material as transducer element are provided. A metal conductive layer is deposited on the delay line substrate material and/or the piezoelectric substrate material. An atomic diffusion bond is formed between the delay line substrate and the piezoelectric substrate. Removal of piezoelectric material is patterned to expose the metal conductive layer(s) to allow electrical contact. A first patterned electrode is deposited to allow external electrical connection to the exposed metal conductive layer(s). A second patterned electrode is deposited to form an active area of the ultrasonic transducer and allows external electrical connection to be made.

DETAILED DESCRIPTION OF THE INVENTION

In order to overcome the common issues with current high-frequency transducer delay-line bonding techniques and significantly enhance the transducer performance, consistency, and reliability as well as lower the transducer manufacturing cost, a novel wafer level fabrication method is employed.

Figure 1:
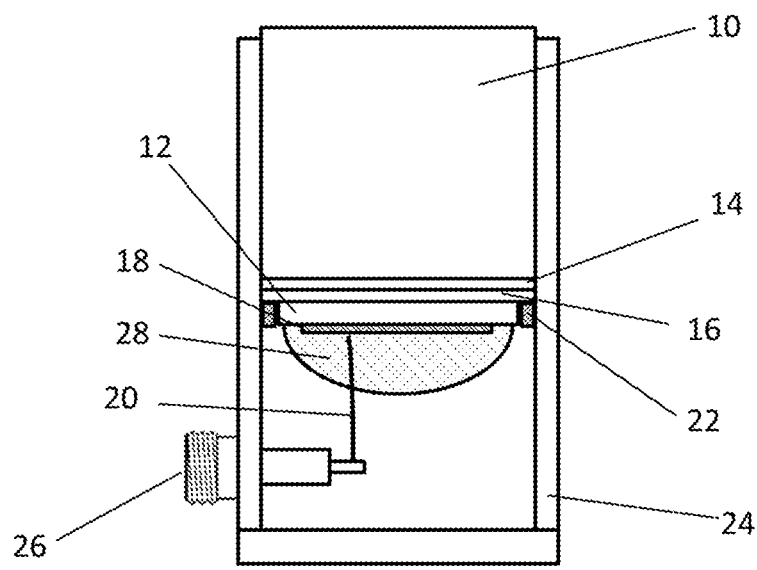
FIG. 1 shows a schematic cross sectional view of an ultrasonic transducer with a delay line as it exists in the prior art.
Figure 2A:
FIG. 2A shows a schematic cross sectional view of a delay line substrate with a thin conductive metal layer.

FIGS. 2A-2F illustrates the basic fabrication steps of a delay line ultrasonic transducer in accordance with this invention. In FIG. 2A, a delay line substrate 30 is fabricated from a suitable material. Such suitable materials may include, but are not limited to, glasses such as fused silica or fused quartz. Alternatively, for example, crystalline materials such as silicon may be used. Ceramic or plastic materials may also be used. The choice of material is dependent on a number of factors including desired acoustic impedance and sound velocity. As will be seen, materials which have a large mis-match in CTE between the materials and the active piezoelectric element do not necessarily need to be excluded due to the low temperature nature of the fabrication steps.

The thickness of the delay-line material will depend on the desired delay time given the sound velocity in the material. The diameter of the delay line substrate 30 can be chosen as any diameter consistent with the fabrication equipment available and subsequent processing steps. Diameters such as 2.54 centimeters to 10.16 centimeters (approximately 1 inch to approximately 4 inches) are common, though it is realized smaller or even larger substrate diameters are possible. As with any wafer-level process, the larger the diameter, the more devices may be yielded, reducing the cost per device (in most cases, a lower limit is determined by the diameter of the active element piezoelectric substrate). The key requirements are that the substrate is atomically smooth, preferable less than 10 Angstroms rms, and flat, preferably better than ¼ wave (at 633 nm). The fabrication of substrates with these characteristics is common in the optics and semiconductor industries and may be accomplished at low cost.

Also shown in FIG. 2A is a first thin metal layer 32 vacuum deposited by conventional means, such as sputter deposition, on the wafer. A number of metal materials may be used, some examples including, but not limited to, Cu, Al, Ti, Ta, Au, Ag, Ni, Fe, and Pt. Since this layer will later be used as an electrode, the thickness should be sufficient for the minimum conductivity required while not so thick that the surface roughness interferes with the bonding process. Such thicknesses, which are material dependent, may usefully range from 10 nm to 100 nm.

Figure 2B:
FIG. 2B shows a schematic cross sectional view of a piezoelectric substrate with a thin conductive metal layer.

In FIG. 2B, the active transducer element in the form of a piezoelectric substrate 40 is shown. As in the case of the delay line substrate, the piezoelectric substrate 40 should be sufficiently smooth and flat. Any number of crystalline or ceramic piezoelectric materials can be used such as $LiNbO_3$, $LiIO_3$, PZT, $BaTiO_3$, ZnO, AlN, and Quartz to name a few. Starting thickness of the piezoelectric substrate 40 could potentially span a large range given the availability of the material at the desired diameter. As in the case with the delay line substrate, the larger the diameter, the more devices may be yielded, reducing the cost per device. Also shown in FIG. 2B is a second thin metal layer 42 deposited with the same material and thickness as the delay line substrate 30. Alternatively, a single thin metal layer may be deposited on either the delay line substrate 30 or the piezoelectric substrate 40. In other words, in some embodiments, just one of the first thin metal layer 32 and the second thin metal layer 42 can be deposited without depositing the other of the first thin metal layer 32 and the second thin metal layer 42. Further, depending on the deposition equipment, one or more of the delay line substrate 30 and the piezoelectric substrate 40 may be loaded in the deposition chamber and may receive the same metal deposition, reducing processing steps and cost.

After the first thin metal layer 32, the second thin metal layer 42, or both the first and second thin metal layers 32, 42 are deposited on the respective substrates 30, 40, and the substrates 30, 40 are sufficiently clean, the two wafers may be pressed together to form an atomic diffusion bond. This may be carried out at room temperature in air or ideally, in a vacuum. This type of bonding is extremely strong and robust and provides an efficient acoustic energy coupling between the two materials allowing the efficient transfer of ultrasonic waves in both directions.

Figure 2C:
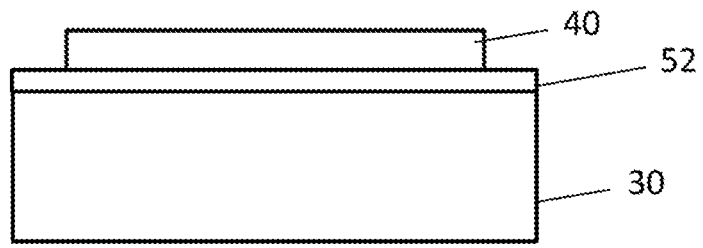
FIG. 2C shows a schematic cross sectional view of a delay line substrate bonded with a piezoelectric substrate.

FIG. 2C shows the bonded metal layers 52 of the delay line substrate 30 and the piezoelectric substrate 40. If the wafer thickness of the piezoelectric substrate 40 is thicker than the required thickness for the desired resonant frequency, the piezoelectric substrate 40 may be thinned to the desired thickness. Given that the substrates are bonded, the delay line substrate 30 provides a convenient backing plate or holder for thinning the piezoelectric substrate 40. Thinning of such a substrate may be carried out by conventional grinding and polishing means as is well known in the art. Since the entire substrate is thinned, many devices can potentially be yielded and the uniformity can be improved over that achieved by thinning individual devices as is typically done in the current art.

Figure 2D:
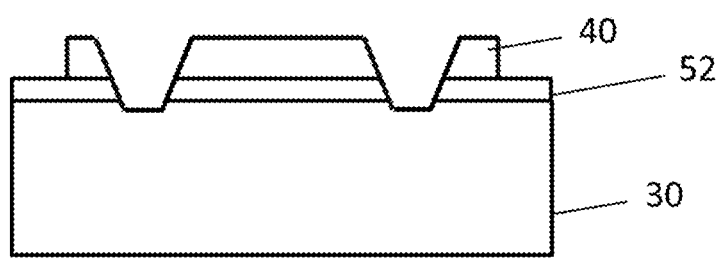
FIG. 2D shows a schematic cross sectional view of a delay line substrate bonded with a piezoelectric substrate and the conductive metal layers exposed.

Once the desired thickness of the piezoelectric substrate 40 is attained, exposure to the bonded metal layers 52, shown in FIG. 2D, is needed in order to make an electrical connection and form one of the two electrodes that will be used to electrically-stimulate the piezoelectric substrate 40. This may be achieved by a variety of techniques including machining using a conventional milling machine, an appropriate photomask combined with selective etching using reactive gases, ion milling, or a selective wet chemical etch. Such techniques are well known in the art.

Figure 2E:
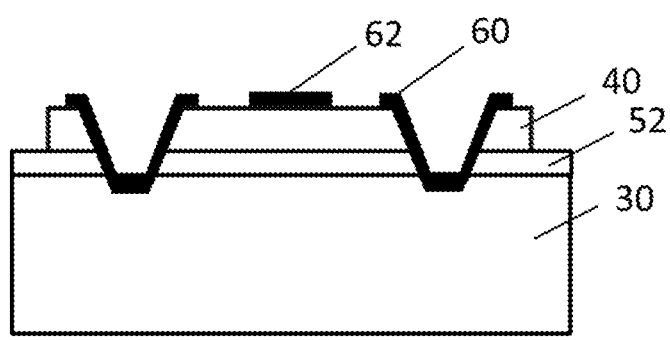
FIG. 2E shows a schematic cross sectional view of a delay line substrate bonded with a piezoelectric substrate and metal electrodes.

Once the bonded metal layers 52 are exposed, a first conductive layer 60, shown in FIG. 2E, preferably a metal, can be deposited by conventional means and patterned using a shadow mask. The first conductive layer 60, which forms a first electrode, should be patterned to allow external connection of the bonded metal layers 52 without interfering with a second conductive layer 62 that defines the active area of the device and that forms a second electrode providing a convenient means of applying an external voltage to the two electrodes to stimulate the piezoelectric substrate 40. A single shadow mask may be used along with a single metal deposition to define both of the electrodes.

Figure 2F:
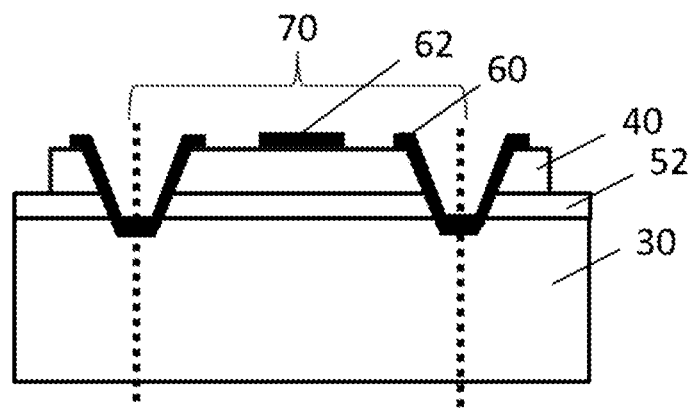
FIG. 2F shows a schematic cross sectional view of a delay line substrate bonded with a piezoelectric substrate and metal electrodes with dotted lines indicating where the substrate is core drilled to form individual devices.

Up to this point, the processing is done at the wafer level as a batch process significantly reducing manufacturing cost. Individual devices 70 may be obtained by using conventional core-drilling techniques from the bonded wafer substrates as shown in FIG. 2F. If a high bandwidth device is desired, a backing layer can be added. Typically, an epoxy impregnated with small dense metal particles, such as silver or tungsten is used. Small size (compared to the wavelength of the acoustic waves generated in the transducer) dense metal particles in an epoxy matrix will provide a high acoustic impedance and hence a high degree of damping while scattering, diffusing, and absorbing the backward travelling acoustic wave that is coupled into the material. This can produce a transducer with a short temporal response resulting in a high resolution device. The individual device 70 may be mounted in a an appropriate case and external connection of the first conductive layer 60 and the second conductive layer 62 can be made with any number of conventional means. A proper stimulus voltage, typically in the form of a pulse, may be applied to the two electrodes producing an ultrasonic wave which will propagate from the piezoelectric material into the delay line and may be used to interrogate a given test material that is coupled to the delay line. After the appropriate delay time, a reflected wave from the interrogated test material will propagate back to the piezoelectric material and can be measured with appropriate receiver electronics.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

LIST OF REFERENCE NUMBERS 30 delay line substrate
32 first thin metal layer
40 piezoelectric substrate
42 second thin metal layer
52 bonded metal layers
60 first conductive layer
62 second conductive layer
70 individual devices

What is claimed is:

1. An ultrasonic transducer comprising: a delay line; a piezoelectric element; an interposing metal conductive layer between the delay line and the piezoelectric element; and an atomic diffusion bond joining the delay line and the piezoelectric element to facilitate coupling ultrasonic waves from the piezoelectric element into the delay line or from the delay line into the piezoelectric element, the atomic diffusion bond extending continuously across an entire surface of the piezoelectric element that overlaps the delay line, the atomic diffusion bond created at room temperature being free from thermal bonding stress.

2. The ultrasonic transducer of claim 1 wherein the delay line is made from glass containing the elements of silicon or fluorine.

3. The ultrasonic transducer of claim 1 wherein the delay line includes at least one from a group consisting of fused silica, fused quartz, and single crystal silicon.

4. The ultrasonic transducer of claim 1 wherein the piezoelectric element is made from a piezoelectric crystalline material.

5. The ultrasonic transducer of claim 1 wherein the piezoelectric element is made from a piezoelectric ceramic material.

6. The ultrasonic transducer of claim 1 wherein the piezoelectric element includes at least one from a group consisting of: $LiNbO_3$, $LiIO_3$, PZT, $BaTiO_3$, ZnO, AlN, and Quartz.

7. The ultrasonic transducer of claim 1 wherein the interposing metal conductive layer includes at least one from a group consisting of: Cu, Al, Ti, Ta, Au, Ag, Ni, Fe, and Pt.

8. The ultrasonic transducer of claim 1, wherein the interposing metal conductive layer comprises a first thin metal layer deposited on the delay line and a second thin metal layer deposited on the piezoelectric element, the first thin metal layer and the second thin metal layer joined by the atomic diffusion bond.

9. The ultrasonic transducer of claim 1, wherein the interposing metal conductive layer comprises a thin metal layer deposited on one of the delay line and the piezoelectric element, and the thin metal layer is joined by the atomic diffusion bond with the other of the delay line and the piezoelectric element.

10. A method of producing an ultrasonic transducer, the method comprising the steps of: providing a delay line substrate material; providing a piezoelectric substrate material as a transducer element; depositing a first metal conductive layer on the delay line substrate material; depositing a second metal conductive layer on and across an entire surface of the piezoelectric substrate material; forming an atomic diffusion bond at room temperature between the first metal conductive layer and the second metal conductive layer, the atomic diffusion bond extending continuously across an entire surface of the piezoelectric substrate material that overlaps the delay line substrate; patterning removal of a portion of the piezoelectric substrate material to expose at least one of the first metal conductive layer and the second metal conductive layer to allow electrical contact; depositing a first patterned electrode on the exposed at least one of the first metal conductive layer and the second metal conductive layer to allow external electrical connection to the exposed at least one of the first metal conductive layer and the second metal conductive layer; and depositing a second patterned electrode on the piezoelectric substrate material to form an active area of the ultrasonic transducer and to allow external electrical connection to be made.

11. The ultrasonic transducer of claim 10 wherein the delay line is made from glass containing the elements of silicon or fluorine.

12. The ultrasonic transducer of claim 10 wherein the delay line includes at least one from a group consisting of fused silica, fused quartz, and single crystal silicon.

13. The ultrasonic transducer of claim 10 wherein the piezoelectric element is made from a piezoelectric crystalline material.

14. The ultrasonic transducer of claim 10 wherein the piezoelectric element is made from a piezoelectric ceramic material.

15. The ultrasonic transducer of claim 10 wherein the piezoelectric element includes at least one from a group consisting of: LiNbO3, LiIO3, PZT, BaTiO3, ZnO, AlN, and Quartz.

16. The ultrasonic transducer of claim 10 wherein the first metal conductive layer and the second metal conductive layer includes at least one from a group consisting of: Cu, Al, Ti, Ta, Au, Ag, Ni, Fe, and Pt.

17. A method of producing an ultrasonic transducer, the method comprising the steps of: providing a delay line substrate; providing a piezoelectric substrate as transducer element; depositing a metal conductive layer on one of the delay line substrate and the piezoelectric substrate; forming an atomic diffusion bond at room temperature between the metal conductive layer deposited on the one of the delay line substrate and the piezoelectric substrate and the other of the delay line substrate and the piezoelectric substrate, the atomic diffusion bond extending continuously across an entire surface of the piezoelectric substrate material that overlaps the delay line substrate; patterning removal of a portion of piezoelectric substrate to expose the metal conductive layer to allow electrical contact; depositing a first patterned electrode on the exposed metal conductive layer to allow external electrical connection to the exposed metal conductive layer; and depositing a second patterned electrode on the piezoelectric substrate to form an active area of the ultrasonic transducer and to allow external electrical connection to be made.

18. The ultrasonic transducer of claim 1, wherein at least one of the delay line and the piezoelectric element has a bonding surface with a roughness less than 10 Angstroms root mean square.

19. The ultrasonic transducer of claim 1, wherein at least one of the delay line and the piezoelectric element has a bonding surface flatness better than wave at 633 nm.

20. The ultrasonic transducer of claim 1, wherein the interposing metal conductive layer is exposed where a portion of the piezoelectric element has been removed.

21. The ultrasonic transducer of claim 1, wherein the interposing metal conductive layer has a thickness between 10 nanometers and 100 nanometers.

22. An ultrasonic transducer comprising: a delay line; a piezoelectric element, at least one of the delay line and the piezoelectric element having a bonding surface with a roughness less than 10 Angstroms root mean square; an interposing metal conductive layer between the delay line and the piezoelectric element; and an atomic diffusion bond joining the delay line and the piezoelectric element to facilitate coupling ultrasonic waves from the piezoelectric element into the delay line or from the delay line into the piezoelectric element, the atomic diffusion bond extending continuously across an entire surface of the piezoelectric element that overlaps the delay line.

23. An ultrasonic transducer comprising: a delay line; a piezoelectric element, at least one of the delay line and the piezoelectric element having a bonding surface flatness better than wave at 633 nm; an interposing metal conductive layer between the delay line and the piezoelectric element; and an atomic diffusion bond joining the delay line and the piezoelectric element to facilitate coupling ultrasonic waves from the piezoelectric element into the delay line or from the delay line into the piezoelectric element, the atomic diffusion bond extending continuously across an entire surface of the piezoelectric element that overlaps the delay line.

* * * * *

UNITED STATES PATENT AND TRADEMARK OFFICE
CERTIFICATE OF CORRECTION

PATENT NO. : 12,296,361 B2
APPLICATION NO. : 16/204418
DATED : May 13, 2025
INVENTOR(S) : James M. Chwalek and Todd A. Jackson Page 1 of 1

It is certified that error appears in the above-identified patent and that said Letters Patent is hereby corrected as shown below:

In the Claims

In Column 6, Line 54 within Claim 6, "LilO3" should read "LiIO3".
In Column 7, Line 41 within Claim 15, "LilO3" should read "LiIO3".
In Column 8, Line 22 within Claim 19, insert --1/4-- between "than" and "wave".
In Column 8, Line 44 within Claim 23, insert --1/4-- between "than" and "wave".

Signed and Sealed this
Fifth Day of August, 2025

Coke Morgan Stewart
*Acting Director of the United States Patent and Trademark Office*